(12) United States Patent
Aizawa et al.

(10) Patent No.: US 11,232,813 B2
(45) Date of Patent: Jan. 25, 2022

(54) FILM-FORMING APPARATUS AND METHOD FOR MANUFACTURING MAGNETIC RECORDING MEDIUM

(71) Applicant: Sony Corporation, Tokyo (JP)

(72) Inventors: Takashi Aizawa, Miyagi (JP); Atsuhiro Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 348 days.

(21) Appl. No.: 16/052,817

(22) Filed: Aug. 2, 2018

(65) Prior Publication Data

US 2018/0366150 A1 Dec. 20, 2018

Related U.S. Application Data

(62) Division of application No. 14/666,540, filed on Mar. 24, 2015, now abandoned.

(30) Foreign Application Priority Data

Mar. 31, 2014 (JP) .................................. 2014-074954

(51) Int. Cl.
*G11B 5/851* (2006.01)
*G11B 5/84* (2006.01)
(Continued)

(52) U.S. Cl.
CPC ............ *G11B 5/84* (2013.01); *G11B 5/00813* (2013.01); *G11B 5/64* (2013.01); *G11B 5/65* (2013.01);
(Continued)

(58) Field of Classification Search
CPC ............ H01J 37/3405; H01J 37/32752; G11B 5/00813; G11B 5/84; G11B 5/78; G11B 5/851; H01F 41/18
See application file for complete search history.

(56) References Cited

U.S. PATENT DOCUMENTS 4,989,543 A * 2/1991 Schmitt ............... C23C 16/4412
118/723 E
5,300,189 A * 4/1994 Kokaku .................. B29C 59/14
216/67
(Continued)

FOREIGN PATENT DOCUMENTS

CN 1697030 11/2005
JP 62-205518 A 9/1987
(Continued)

OTHER PUBLICATIONS

Japanese Office Action dated May 10, 2016 in corresponding Japanese Application No. 2014-074954 (6 pages).
(Continued)

*Primary Examiner* — Tabassom Tadayyon Eslami
(74) *Attorney, Agent, or Firm* — K&L Gates LLP

(57) ABSTRACT

A film-forming apparatus and a method for manufacturing a magnetic recording medium are provided. The film-forming apparatus includes a rotating body which moves a base material with a strip shape which has flexibility, a plurality of cathodes which are provided to oppose a rotating surface of the rotating body; and a plurality of accommodating sections which accommodate each of the plurality of cathodes. The method includes sequentially film-forming a plurality of thin films on a base material using a plurality of cathodes which are provided on a moving path of the base material while moving the base material with a strip shape which has flexibility. Each of the plurality of cathodes is accommodated in a plurality of accommodating sections.

4 Claims, 8 Drawing Sheets

(51) Int. Cl.
  *G11B 5/64* (2006.01)
  *G11B 5/65* (2006.01)
  *H01J 37/34* (2006.01)
  *G11B 5/008* (2006.01)
  *G11B 5/667* (2006.01)
  *H01J 37/32* (2006.01)

(52) U.S. Cl.
  CPC .............. *G11B 5/656* (2013.01); *G11B 5/667* (2013.01); *G11B 5/851* (2013.01); *H01J 37/32752* (2013.01); *H01J 37/3408* (2013.01); *H01J 37/3411* (2013.01)

(56) References Cited

U.S. PATENT DOCUMENTS

| | | | |
|---|---|---|---|
| 5,589,263 A * | 12/1996 | Ueda | G11B 5/65 428/336 |
| 6,001,446 A | 12/1999 | Nakada et al. | |
| 9,542,967 B2 | 1/2017 | Sekiguchi et al. | |
| 2002/0023589 A1* | 2/2002 | Kondo | H01J 37/32532 118/723 ER |
| 2004/0194701 A1* | 10/2004 | Yadav | C23C 16/402 118/715 |
| 2005/0089726 A1 | 4/2005 | Abarra | |
| 2006/0159844 A1* | 7/2006 | Moriwaki | G11B 5/851 427/127 |
| 2006/0234090 A1 | 10/2006 | Moriwaki et al. | |
| 2007/0218316 A1 | 9/2007 | Inomata | |

FOREIGN PATENT DOCUMENTS

| | | |
|---|---|---|
| JP | 07-110939 A | 4/1995 |
| JP | 10-011734 A | 1/1998 |
| JP | 10-041177 A | 2/1998 |
| JP | 2000-067432 A | 3/2000 |
| JP | 2002-025044 A | 1/2002 |
| JP | 2002-042423 | 2/2002 |
| JP | 2005-353191 A | 12/2005 |
| JP | 2005-353256 A | 12/2005 |
| JP | 2006-185566 A | 7/2006 |
| JP | 2006-286115 A | 10/2006 |
| JP | 2007-179598 A | 7/2007 |
| JP | 2008-065917 A | 3/2008 |
| JP | 2009-059431 A | 3/2009 |

OTHER PUBLICATIONS

Japanese Office Action dated Jan. 10, 2017 in corresponding Japanese application No. 2014-074954 (4 pages).

Chinese Office Action dated Jul. 3, 2018 in corresponding Chinese Application No. 201510129953.2.

* cited by examiner

FILM-FORMING APPARATUS AND METHOD FOR MANUFACTURING MAGNETIC RECORDING MEDIUM

CROSS REFERENCES TO RELATED APPLICATIONS

The present application is a divisional application of U.S. application Ser. No. 14/666,540, filed Mar. 24, 2015, now abandoned which claims priority to Japanese Priority Patent Application JP 2014-074954 filed in the Japan Patent Office on Mar. 31, 2014, the entire content of which is hereby incorporated by reference.

BACKGROUND

The present technology relates to a magnetic recording medium where a laminated film is provided on a base material which has flexibility, a method for manufacturing the same, and a film-forming apparatus for producing the laminated film.

In recent years, due to the development of information technology (IT) in society, movements toward electronic formats in libraries, National Archives, and the like, and the prolonged storage of business documents, there has been an increased demand for increasing the recording density of magnetic tape for data storage.

As a method for manufacturing a magnetic tape with a high recording density, a method has been proposed which, while moving a flexible base material which has a strip shape, film-forms a laminated film on the base material by a sputtering method, a vapor deposition method, or the like. Japanese Unexamined Patent Application Publication No. 2006-286115 (refer to paragraphs [0013] and [0055]), Japanese Unexamined Patent Application Publication No. 2005-353191 (refer to paragraph [0031]), and Japanese Unexamined Patent Application Publication No. 07-110939 (refer to paragraph [0016]) describe that, in this type of manufacturing method, before film-forming the laminated film on the flexible base material, a process of degassing the base material is carried out (for example, refer to Japanese Unexamined Patent Application Publication No. 2006-286115 (refer to paragraphs [0013] and [0055]), Japanese Unexamined Patent Application Publication No. 2005-353191 (refer to paragraph [0031]), and Japanese Unexamined Patent Application Publication No. 07-110939 (refer to paragraph [0016])).

SUMMARY

It is desirable to provide a magnetic recording medium which has excellent reliability, a method for manufacturing the same, and a film-forming apparatus for producing the laminated film.

According to an embodiment of the present technology, there is provided a magnetic recording medium including a base material which has flexibility, and a laminated film, in which a variation in magnetic characteristics is within ±10% over a division of 300 m in a longitudinal direction of the base material.

According to another embodiment of the present technology, there is provided a film-forming apparatus including a rotating body which moves a base material with a strip shape which has flexibility, a plurality of cathodes which are provided to oppose a rotating surface of the rotating body, and a plurality of accommodating sections which accommodate each of the plurality of cathodes.

According to still another embodiment of the present technology, there is provided a method for manufacturing a magnetic recording medium including sequentially film-forming a plurality of thin films on the base material using a plurality of cathodes which are provided on a moving path of the base material while moving the base material with a strip shape which has flexibility, in which each of the plurality of cathodes is accommodated in a plurality of accommodating sections.

As described above, it is possible to realize a magnetic recording medium which has excellent reliability according to the present technique.

Additional features and advantages are described herein, and will be apparent from the following Detailed Description and the figures.

DETAILED DESCRIPTION

In the present technique, a laminated film preferably includes a lower coating layer and a perpendicular recording layer and more preferably includes at least one layer out of an intermediate layer, a soft magnetic layer, and a CAP layer.

In the present technique, each layer of the lower coating layer, the intermediate layer and the perpendicular recording layer may be any of a single layer structure and a multi-layer structure. It is preferable to adopt a multi-layer structure from the viewpoint of further improving magnetic characteristics and/or recording and play back characteristics of a magnetic recording medium. It is preferable to adopt a multi-layer structure with a two-layer structure when considering manufacturing efficiency.

In the present technique, the magnetic recording medium is preferably further provided with a soft magnetic layer between the base material and the lower coating layer or between the lower coating layer and the intermediate layer. Either of a single layer structure or a multi-layer structure may be used as the structure of the soft magnetic layer; however, it is preferable to use a multi-layer structure from the viewpoint of improving recording and play back characteristics. It is preferable that the soft magnetic layer which has the multi-layer structure is provided with a first soft magnetic layer, an intermediate layer, and a second soft magnetic layer, in which the intermediate layer is provided between the first soft magnetic layer and the second soft magnetic layer. In a case where the magnetic recording medium is further provided with the soft magnetic layer, it is preferable for a lower coating layer to be provided between the soft magnetic layer and the lower coating layer.

In the present technique, it is preferable for the lower coating layer, which has an amorphous state and includes an alloy which includes Ti and Cr, to be provided on the base material surface. Due to this, it is possible to suppress an influence which $O_2$ gas, $H_2O$, or the like which is adsorbed on a base material surface has with respect to an intermediate layer and/or a recording layer and to improve smoothness on the base material surface.

Description will be given of embodiments of the present technology in the following order.

Figure 1:
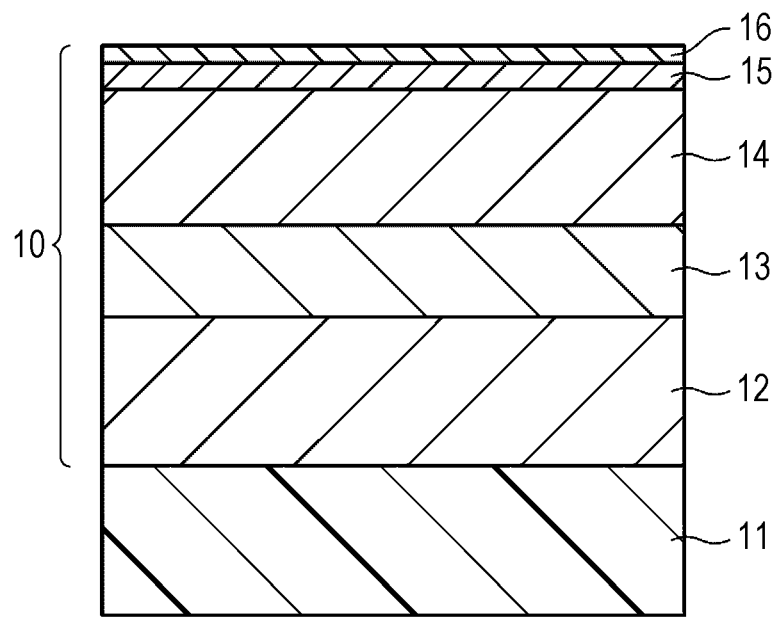
FIG. 1 is a cross-sectional diagram which schematically shows one example of a configuration of a magnetic recording medium according to one embodiment of the present technique.

1. Configuration of Magnetic Recording Medium
2. Configuration of Sputtering Apparatus
3. Method for Manufacturing Magnetic Recording Medium
4. Effects
5. Modified Examples 1. Configuration of Magnetic Recording Medium As shown in FIG. 1, a magnetic recording medium according to one embodiment of the present technology is a so-called single layer perpendicular magnetic recording medium and is provided with a base material 11 and a laminated film 10. The laminated film 10 is provided with a lower coating layer 12 which is provided on a surface of the base material 11, an intermediate layer 13 which is provided on a surface of the lower coating layer 12, and a magnetic recording layer 14 which is provided on a surface of the intermediate layer 13. The laminated film 10 may be further provided with a protective layer 15 which is provided on a surface of the magnetic recording layer 14 and a top coat layer 16 which is provided on a surface of the protective layer 15 according to necessity.

The lower coating layer 12, the intermediate layer 13, and the magnetic recording layer 14 are film-formed by a physical deposition method. As the physical deposition method, a sputtering method is preferable from the viewpoints of productivity or the like. Here, in the present specification, a recording medium which does not have a soft magnetic underlayer is referred to as a "single layer perpendicular magnetic recording medium" and a recording medium which has a soft magnetic underlayer is referred to as a "two-layer perpendicular magnetic recording medium".

The magnetic recording medium is suitable for use as a storage media for data archives for which the demand is expected to increase more and more in the future. The magnetic recording medium is able to realize, for example, a surface recording density of 10 times or more the current coating-type magnetic tape for storage, that is, a surface recording density of 50 Gb/in$^2$. In a case of configuring a general linear recording type data cartridge using a magnetic recording medium which has such a surface recording density, it is possible to record with a large capacity of 50 TB or more for each roll in a data cartridge. The magnetic recording medium is suitable for use for a recording and play back apparatus which uses a ring type recording head and a giant magnetoresistive (GMR) type play back head.

The variation in the magnetic characteristics is within ±10%, preferably within ±5%, over a division of 300 m in the longitudinal direction of the base material 11. By the variation in the magnetic characteristics being within ±10%, the characteristic stability is maintained and it is possible to obtain a magnetic recording medium which has excellent reliability. Here, the magnetic characteristics are at least one characteristic out of a holding power Hc, a squareness ratio Rs, and an orientation strength $\Delta\theta_{50}$ of the magnetic recording layer 14, preferably all of these characteristics. Here, the orientation strength $\Delta\theta_{50}$ is obtained by measuring a diffraction peak of magnetic atoms which are included in the magnetic recording layer 14 in X-ray diffraction peaks of the magnetic recording medium using a locking curve method.

Base Material

The base material 11 which is a support body is, for example, a long film and has a surface which has a longitudinal direction (an MD direction) and a short direction (a TD direction). It is preferable to use a nonmagnetic base material which has flexibility as the base material 11. It is possible to use, for example, a flexible polymer resin material which is used for a normal magnetic recording medium as a material of a nonmagnetic base material. Specific examples of such a polymer material include polyesters, polyolefins, cellulose derivatives, vinyl-based resins, polyimides, polyamides, polycarbonate, or the like.

Lower Coating Layer

The lower coating layer 12 is provided between the base material 11 and the intermediate layer 13. It is preferable that the lower coating layer 12 includes an alloy which includes Ti and Cr and has an amorphous state. In addition, oxygen (O) may be further included in the alloy. The oxygen is impure oxygen which is included in a small amount inside the lower coating layer 12 when film-forming the lower coating layer 12 by a film-forming method such as a sputtering method. Here, "alloy" has the meaning of at least one type of a solid solution, a eutectic body, an intermetallic compound, or the like which includes Ti and Cr. "Amorphous state" has the meaning that a halo is observed by an electron diffraction method and that a crystal structure may not be specified.

The lower coating layer 12 which includes an alloy which includes Ti and Cr and has an amorphous state has an effect of suppressing the influence of $O_2$ gas or $H_2O$ which is adsorbed on the base material 11 and of forming a metallic smooth surface on the surface of the base material 11 by easing unevenness of the surface of the base material 11. Due to this effect, the perpendicular orientation of the intermediate layer 13 is increased. Here, when the state of the lower coating layer 12 is a crystal state, the column shape accompanying the crystal growth is clear, the unevenness of the surface of the base material 11 is increased, and the crystal orientation of the intermediate layer 13 deteriorates.

The ratio of oxygen (O) with respect to the total amount of Ti, Cr, and O which are included in the lower coating layer 12 is preferably 15 atomic % (at %) or less, more preferably 10 atomic % or less. When the ratio of oxygen exceeds 15 atomic %, $TiO_2$ crystals are generated and thus the orientation of the intermediate layer 13 greatly decreases so as to have an influence on crystal nucleation of the intermediate layer 13 which is formed on a surface of the lower coating layer 12.

The ratio of Ti with respect to the total amount of Ti and Cr which are included in the lower coating layer 12 is preferably within a range of 30 atomic % or more to 100 atomic % or less, more preferably 50 atomic % or more to 100 atomic % or less. When the ratio of Ti is less than 30%, a (100) surface of a body-centered cubic lattice (bcc) structure of Cr is orientated and the orientation of the intermediate layer 13 which is formed on a surface of the lower coating layer 12 decreases.

Here, it is possible to determine the ratio of the elements described above as follows. Etching is performed using an ion beam from the top coat layer 16 side of the magnetic recording medium, analysis is carried out using Auger electron spectroscopy with regard to the top surface of the etched lower coating layer 12, and an average atomic number ratio with respect to the film thickness is the ratio of the elements described above. In detail, analysis is performed with regard to the three elements of Ti, Cr, and O and the element content is identified according to the percentage ratios thereof.

The alloy which is included in the lower coating layer 12 may further include an element other than Ti and Cr as an additional element. Examples of the additional element include one or more types of elements which are selected from a group formed of, for example, Nb, Ni, Mo, Al, W, and the like.

Here, the lower coating layer 12 is not limited to a single layer structure and may be a multi-layer structure with two or more layers. For example, in a case where the lower coating layer 12 has a two-layer structure, the lower coating layer 12 is provided with a first lower coating layer (an upper side lower coating layer) and a second lower coating layer (a lower side lower coating layer). The first lower coating layer is provided on the magnetic recording layer 14 side and the second lower coating layer is provided on the base material 11 side. For the second lower coating layer, it is possible to use the same layer as the lower coating layer 12 described above. The first lower coating layer includes, for example, a material with a different composition to the second lower coating layer. Specific examples of the material include NiW, Ta, or the like. Here, it is possible to regard the first lower coating layer as not a lower coating layer but an intermediate layer which is provided between the second lower coating layer and the magnetic recording layer 14.

Intermediate Layer

It is preferable that the intermediate layer 13 has the same crystal structure as the magnetic recording layer 14. In a case where the magnetic recording layer 14 includes a Co-based alloy, it is preferable that the intermediate layer 13 includes a material which has the same hexagonal close packing (hcp) structure as a Co-based alloy and that a c axis of the structure is orientated in the vertical direction (that is, the film thickness direction) with respect to the film surface. This is because it is possible to improve the orientation of the magnetic recording layer 14 and to make matching of lattice constants of the intermediate layer 13 and the magnetic recording layer 14 comparatively favorable. It is preferable to use a material which includes Ru as the material which has a hexagonal close packing (hcp) structure and, in detail, a Ru single body or a Ru alloy is preferable. Examples of the Ru alloy include a Ru alloy oxide such as Ru—$SiO_2$, Ru—$TiO_2$, or Ru—$ZrO_2$. In addition, a material which includes Ni, Ta, or the like may be used in the intermediate layer 13 instead of the material which includes Ru. It is possible to use an Ni alloy, for example, such as NiW as a material which includes Ni.

Here, the intermediate layer 13 is not limited to a single layer structure and may be a multi-layer structure with two or more layers. For example, in a case where the intermediate layer 13 has a two-layer structure, the intermediate layer 13 is provided with a first intermediate layer (an upper side intermediate layer) and a second intermediate layer (a lower side intermediate layer). The first intermediate layer is provided on the magnetic recording layer 14 side and the second intermediate layer is provided on the lower coating layer 12 side.

As the material of the first intermediate layer and the second intermediate layer, it is possible to use, for example, the same material as for the intermediate layer 13 described above. However, the desired effects in each of the first intermediate layer and the second intermediate layer are different and therefore the film-forming conditions for each are different. That is, for the first intermediate layer, a film structure which promotes a granular structure in the magnetic recording layer 14 which is the upper layer thereof is preferable and, for the second intermediate layer, a film structure with high crystal orientation is preferable.

Magnetic Recording Layer

It is preferable that the magnetic recording layer 14 is a perpendicular recording layer, in more detail, a granular magnetic layer which includes a Co-based alloy from the viewpoint of improving the recording density. The granular magnetic layer is configured by strongly magnetic crystal particles which includes a Co-based alloy and a nonmagnetic particle boundary (a nonmagnetic body) which surrounds the strongly magnetic crystal particles. In more detail, the granular magnetic layer is configured by columns (columnar crystal) which include a Co-based alloy and a nonmagnetic particle boundary (for example, an oxide such as $SiO_2$) which surrounds the columns and magnetically separates each column. In this structure, it is possible to configure the magnetic recording layer 14 which has a structure where each column is magnetically separated.

A Co-based alloy has a hexagonal close packing (hcp) structure and the c axis thereof is orientated in the vertical direction (the film thickness direction) with respect to the film surface. It is preferable to use a CoCrPt-based alloy which contains at least Co, Cr, and Pt as the Co-based alloy. The CoCrPt-based alloy is not particularly limited and the CoCrPt-based alloy may further include an additional element. Examples of the additional elements include one or more types of elements which are selected from a group formed of, for example, Ni, Ta, and the like.

The nonmagnetic particle boundary which surrounds the strongly magnetic crystal particles includes a nonmagnetic metallic material. Here, the metals include semi-metals. It is possible to use at least one of a metal oxide and a metal nitride as the nonmagnetic metallic material and it is preferable to use a metal oxide from the viewpoint of stably maintaining a granular structure. Examples of metal oxides include a metal oxide which includes at least one or more types of elements which are selected from a group formed of Si, Cr, Co, Al, Ti, Ta, Zr, Ce, Y, Hf, and the like and a metal oxide which includes at least a Si oxide (that is, $SiO_2$) is preferable. Specific examples thereof include $SiO_2$, $Cr_2O_3$, CoO, $Al_2O_3$, $TiO_2$, $Ta_2O_5$, $ZrO_2$, $HfO_2$, or the like. Examples of metal nitrides include a metal nitride which includes at least one or more types of elements which are selected from a group formed of Si, Cr, Co, Al, Ti, Ta, Zr, Ce, Y, Hf, and the like. Specific examples thereof include SiN, TiN, AlN, or the like.

It is preferable that the magnetic recording layer 14 has the average composition shown in the following formula from the viewpoint of realizing further improvement of a signal-noise ratio (SNR). This is because it is possible to suppress an influence of a demagnetizing field and realize a saturation magnetization quantity Ms which is able to secure a sufficient play back output, and it is possible to secure a high SNR due to this.

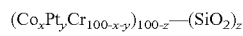

$(Co_xPt_yCr_{100-x-y})_{100-z}-(SiO_2)_z$ (here, in the formula, x, y, and z are respectively values within a range of $69 \leq x \leq 72$, $12 \leq y \leq 16$, and $9 \leq z \leq 12$).

Here, it is possible to obtain the composition described above as follows. Etching is performed using an ion beam from the top coat layer 16 side of a magnetic recording medium, analysis is carried out by Auger electron spectroscopy with regard to the top surface of the etched magnetic recording layer 14, and an average atomic number ratio with respect to the film thickness is determined as the composition described above. In detail, analysis is performed with regard to the five elements of Co, Pt, Cr, Si, and O and the element content is identified according to the percentage ratios thereof.

A magnetic recording medium according to the present embodiment is a single layer magnetic recording medium which does not have a underlayer (a soft magnetic underlayer) which includes a soft magnetic material; however, in this type of magnetic recording medium, there is a tendency for sufficient recording in the vertical direction to be difficult when the influence of a demagnetizing field which is caused by the magnetic recording layer 14 is great in the vertical direction. Since the demagnetizing field becomes large in proportion to the saturation magnetization quantity Ms of the magnetic recording layer 14, it is desirable to make the saturation magnetization quantity Ms small in order to suppress the demagnetizing field. However, when the saturation magnetization quantity Ms is small, a residual magnetic quantity Mr is small and the play back output decreases. Accordingly, it is preferable to select a material which is included in the magnetic recording layer 14 from the viewpoint of obtaining both of suppression of the influence of the demagnetizing field (that is, reduction of the saturation magnetization quantity Ms), and the residual magnetic quantity Mr being able to secure sufficient play back output. In the average composition in the above formula, it is possible to obtain both of these characteristics and to secure a high SNR.

Protective Layer

The protective layer 15 includes, for example, a carbon material or silicon dioxide (SiO2) and it is preferable to include a carbon material from the viewpoint of the film strength of the protective layer 15. Examples of carbon materials include graphite, diamond-like carbon (DLC), diamonds, or the like.

Top Coat Layer

The top coat layer 16 includes, for example, a lubricant. It is possible to use, for example, a silicone-based lubricant, a hydrocarbon-based lubricant, a fluorinated hydrocarbon-based lubricant, or the like as a lubricant.

2. Configuration of Sputtering Apparatus

Figure 2:
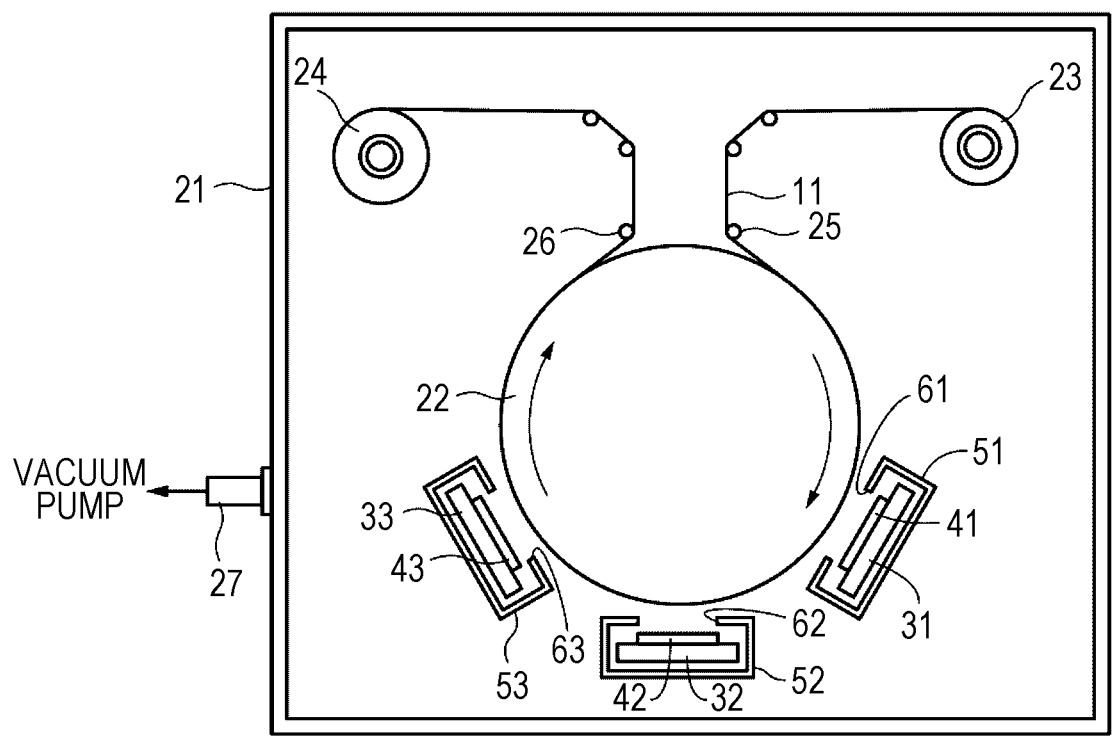
FIG. 2 is a schematic diagram which shows one example of a configuration of a sputtering apparatus which is used for manufacturing a magnetic recording medium according to one embodiment of the present technique.

As shown in FIG. 2, a sputtering apparatus according to one embodiment of the present technology is a continuous winding type sputtering apparatus and is provided with a film-forming chamber 21, a drum 22 which is a metal can (a rotating body), cathodes 31 to 33, cathode accommodating chambers 51 to 53, a supply reel 23, a winding reel 24, and a plurality of guide rolls 25 and 26. The sputtering apparatus is, for example, a direct current (DC) magnetron sputtering type apparatus; however, the sputtering method is not limited to this type.

The film-forming chamber 21 is connected with a vacuum pump, which is not shown in the diagram, via an exhaust port 27, and the atmosphere inside the film-forming chamber 21 is set to a predetermined degree of vacuum by the vacuum pump. The drum 22, the supply reel 23, and the winding reel 24 are arranged inside the film-forming chamber 21 with a configuration where rotation is possible. Inside the film-forming chamber 21, the plurality of guide rolls 25 for guiding transportation of the base material 11 between the supply reel 23 and the drum 22 are provided and the plurality of guide rolls 26 for guiding transportation of the base material 11 between the drum 22 and the winding reel 24 are provided. The base material 11 which is wound out from the supply reel 23 is wound by the winding reel 24 via the guide roll 25, the drum 22, and the guide roll 26 during sputtering. The drum 22 has a columnar shape and the base material 11 with a strip shape is transported along a peripheral surface of the columnar surface shape of the drum 22. A cooling mechanism which is not shown in the diagram is provided in the drum 22 and is cooled to, for example, approximately −20° C. during sputtering.

The plurality of cathodes 31 to 33 are arranged opposing the peripheral surface of the drum 22 and at equal intervals in the peripheral direction of the drum 22 inside the film-forming chamber 21. It is possible to attach targets 41 to 43 to the cathodes 31 to 33 respectively. In a case of manufacturing a magnetic recording medium which has the configuration described above, targets for film-forming the lower coating layer 12, the intermediate layer 13, and the magnetic recording layer 14 are respectively set as the targets 41 to 43. A plurality of types of films, for example, the three layers of the lower coating layer 12, the intermediate layer 13, and the magnetic recording layer 14 are simultaneously film-formed by the cathodes 31 to 33 with one transportation of the base material 11.

The plurality of cathode accommodating chambers 51 to 53 for accommodating each of the plurality of cathodes 31 to 33 are further arranged inside the film-forming chamber 21. The cathode accommodating chambers 51 to 53 respectively have opening sections 61 to 63 on the side opposing the drum 22. Sputtering particles which are sputtered from the targets 41 to 43 and discharged into vapor reach the base material 11 which is transported along the peripheral surface of the drum 22 via the opening sections 61 to 63 and a thin film is formed.

The cathode accommodating chambers 51 to 53 are configured so as to be able to independently carry out vacuuming and exhausting inside the accommodating chambers and to carry out heating and cooling control of the wall sections thereof. The cathode accommodating chambers 51 to 53 may be configured such that it is possible to independently introduce a process gas to the accommodating chambers.

The atmosphere of the film-forming chamber 21 during sputtering is set, for example, to approximately $1\times10^{-5}$ Pa to $5\times10^{-5}$ Pa. It is possible to control the film thickness and characteristics (for example, magnetic characteristics) of the lower coating layer 12, the intermediate layer 13, and the magnetic recording layer 14 by adjusting a tape line speed which winds the base material 11, the pressure (sputtering gas pressure) of Ar gas which is introduced during sputtering, supplied electrical power, and the like. It is preferable that the tape line speed is within a range of approximately 1 m/min to 10 m/min. It is preferable that the sputtering gas pressure is within a range of approximately 0.1 Pa to 5 Pa. It is preferable that the supplied electrical power amount is within a range of approximately 30 mW/mm2 to 150 mW/mm2.

In the sputtering apparatus which has the configuration described above, it is possible to continuously film-form the lower coating layer 12, the intermediate layer 13, and the magnetic recording layer 14 using a roll to roll method.

3. Method for Manufacturing Magnetic Recording Medium

Below, description will be given of one example of a method for manufacturing a magnetic recording medium according to one embodiment of the present technology with reference to FIG. 2 and FIG. 3A to FIG. 3C. Here, in each process shown below, since the cathode accommodating chambers 51 to 53 are in substantially the same state, the state inside the cathode accommodating chamber 51 is representatively shown in FIG. 3A to FIG. 3C and the states of the other cathode accommodating chambers 52 and 53 are omitted in the diagrams.

Process of Vacuuming and Exhausting

Figure 3A:
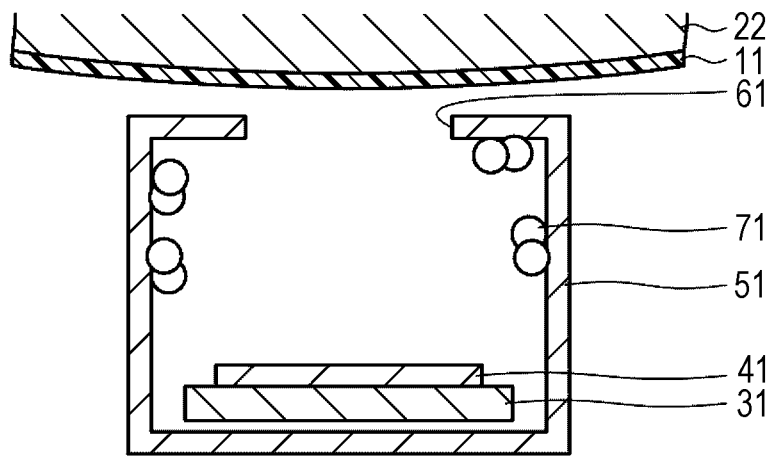
FIG. 3A is a schematic diagram which shows a state of a cathode accommodating chamber before a heating process.

Firstly, the inside of the film-forming chamber 21 and the insides of the cathode accommodating chambers 51 to 53 are vacuumed and exhausted to a predetermined degree of vacuum. In more detail, after the inside of the film-forming chamber 21 reaches a predetermined degree of vacuum due to the vacuuming of the inside of the film-forming chamber 21, each of the chambers is set to a predetermined degree of vacuum by vacuuming the insides of the cathode accommodating chambers 51 to 53. Alternatively, each of the chambers is set to a predetermined degree of vacuum by simultaneously vacuuming and exhausting the inside of the film-forming chamber 21 and the insides of the cathode accommodating chambers 51 to 53. The degree of vacuum of each of the cathode accommodating chambers 51 to 53 is independently set, for example, according to the characteristics, composition, or the like of each layer which is laminated on the base material 11. In a state where the insides of the cathode accommodating chambers 51 to 53 are vacuumed, as shown in FIG. 3A, gas 71 such as $O_2$ or $H_2O$ remains on the inner wall surfaces of the cathode accommodating chambers 51 to 53.

Process of Heating Process

Figure 3B:
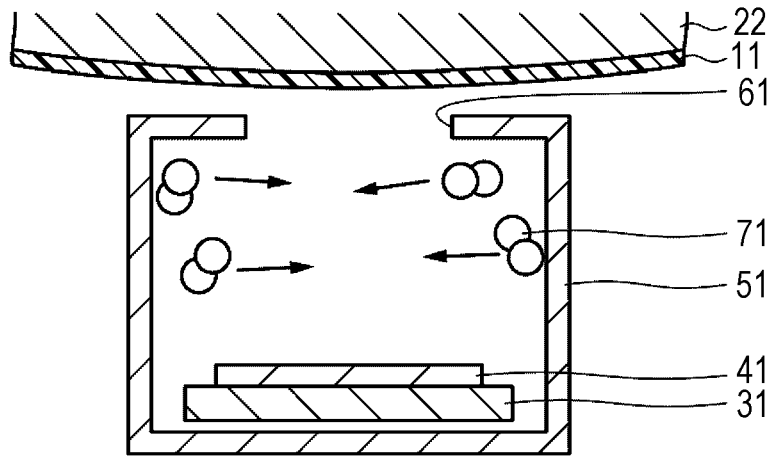
FIG. 3B is a schematic diagram which shows a state of a cathode accommodating chamber during a heating process.

Next, it is preferable to carry out a heating process on the wall sections of the cathode accommodating chambers 51 to 53. This is because, due to this, it is possible to discharge the remaining gas 71 such as $O_2$ or $H_2O$ from the inner wall surfaces of the cathode accommodating chambers 51 to 53 as shown in FIG. 3B. From the viewpoint of reducing the remaining gas 71, it is preferable to keep the inner wall surfaces of the cathode accommodating chambers 51 to 53 at 200° C. or higher for 30 minutes or longer by the heating process.

Film-Forming Process of Lower Coating Layer, Intermediate Layer, and Magnetic Recording Layer Next, the lower coating layer 12, the intermediate layer 13, and the magnetic recording layer 14 are film-formed on the base material 11. In detail, the film-forming is carried out as follows. That is, the lower coating layer 12, the intermediate layer 13, and the magnetic recording layer 14 are sequentially film-formed on a surface of the base material 11 which moves along the peripheral surface of the drum 22 by carrying out sputtering on the targets 41 to 43 which are respectively set in the cathodes 31 to 33 while introducing a process gas such as Ar gas into the film-forming chamber 21.

It is more preferable to continuously film-form all of the three layers of the lower coating layer 12, the intermediate layer 13, and the magnetic recording layer 14 on the surface of the moving base material 11 in one process which winds out the base material 11 from the supply reel 23 to be wound onto the winding reel 24 via the drum 22. Here, in the one process which winds out the base material 11 from the supply reel 23 to be wound onto the winding reel 24 via the drum 22, the remaining one layer (for example, the magnetic recording layer 14) may be film-formed in a further process which film-forms two adjacent layers (for example, the lower coating layer 12 and the intermediate layer 13), winds out the base material 11 from the winding reel 24 again to be wound onto the supply reel 23. However, the former film-forming method is preferable since there is a concern that deterioration in a surface state of a film will occur in the latter film-forming method.

Figure 3C:
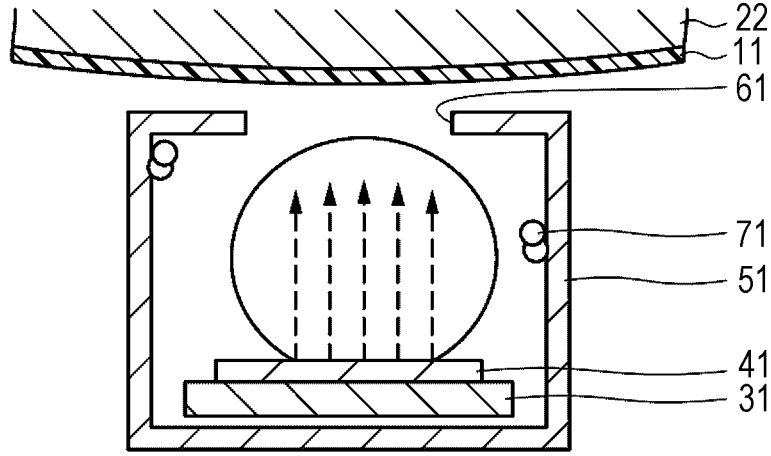
FIG. 3C is a schematic diagram which shows a state of a cathode accommodating chamber during a cooling process.

In the film-forming process described above, it is preferable to carry out a cooling process on the wall sections of cathode accommodating chambers 51 to 53. This is because, due to this, it is possible to suppress discharge of the remaining gas 71 such as $O_2$ or $H_2O$ which remains on the inner wall surfaces of the cathode accommodating chambers 51 to 53 as shown in FIG. 3C. From the viewpoint of suppressing discharge of the remaining gas 71, it is preferable to keep the temperature of the inner wall surfaces of the cathode accommodating chambers 51 at 53 at 90° C. or less during the film-forming.

Film-Forming Process of Protective Layer

Next, for example, the base material 11 which is wound onto the winding reel 24 is transported from a sputtering apparatus to another film-forming apparatus and the protective layer 15 is film-formed on the surface of the magnetic recording layer 14. It is possible to use, for example, a chemical vapor deposition (CVD) method or a physical vapor deposition (PVD) method as a method for film-forming the protective layer 15.

Film-Forming Process of Top Coat Layer

Next, for example, the base material 11 is transported to a coating apparatus, a lubricant or the like is coated on a surface of the protective layer 15, and the top coat layer 16 is film-formed. It is possible to use various types of coating methods, for example, such as gravure coating and dip coating as the lubricant coating method.

Due to the above, the magnetic recording medium shown in FIG. 1 is obtained.

4. Effects

In the magnetic recording medium according to the present embodiment, since variation in magnetic characteristics is suppressed within ±10% over a division of 300 m in a longitudinal direction of a magnetic recording medium with a strip shape, it is possible to stabilize magnetic characteristics in the longitudinal direction of the magnetic recording medium. That is, it is possible to provide a magnetic recording medium which has excellent reliability. In addition, it is possible to provide a magnetic recording medium with excellent in magnetic characteristics where recording is possible by a head for in-plane magnetic recording and the intermediate layer 13 and the magnetic recording layer 14 have favorable crystal orientation growth.

In the sputtering apparatus according to the present embodiment, since each of the cathodes 31 to 33 is covered by the cathode accommodating chambers 51 to 53 in an individual accommodating chamber, it is possible to secure the stability of the magnetic characteristics in the longitudinal direction of the magnetic recording medium. In a case where the cathode accommodating chambers 51 to 53 are not provided, without being able to control the optimum gas pressure of each laminated film, defects are generated such as not being able to secure the desired film characteristics, not being able to hold the characteristic stability by being influenced across the board by the degassing, and the like.

In the sputtering apparatus according to the present embodiment, in a case of keeping the inner wall surfaces of the cathode accommodating chambers 51 to 53 at a certain temperature or less during the continuous sputtering film-forming, it is possible to suppress discharging of the remaining gas 71 from the inner wall surfaces and improve the stability of magnetic characteristics in the longitudinal direction of a magnetic recording medium.

5. Modified Examples

In the embodiment described above, description was given of examples where the present technology was applied with respect to a magnetic recording medium which has a configuration where the lower coating layer 12, the intermediate layer 13, and the magnetic recording layer 14 are sequentially laminated on the base material 11, a method for manufacturing the same, and a sputtering apparatus; however, the present technology is not limited thereto.

Modified Example 1

Figure 4:
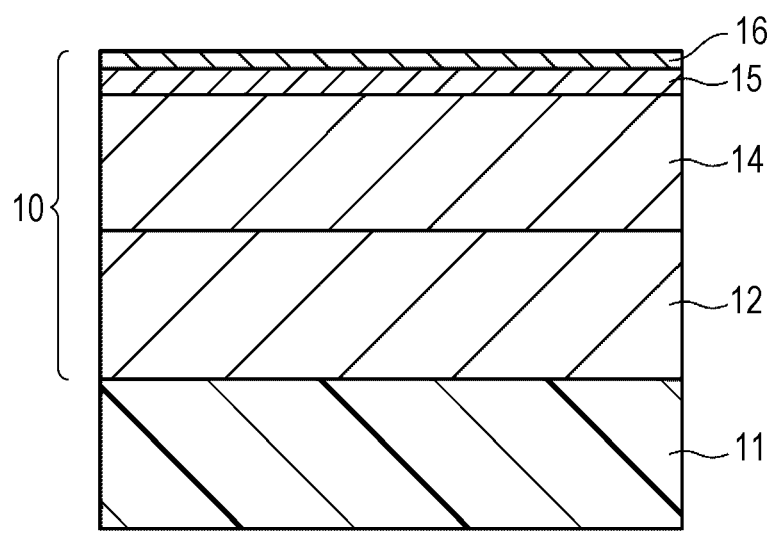
FIG. 4 is a cross-sectional diagram which schematically shows one example of a configuration of a magnetic recording medium according to a modified example 1 of one embodiment of the present technique.

As shown in FIG. 4, a magnetic recording medium may have a configuration where the intermediate layer 13 between the lower coating layer 12 and the magnetic recording layer 14 (refer to FIG. 1) is omitted and the lower coating layer 12 and the magnetic recording layer 14 are adjacent. A sputtering apparatus for manufacturing the magnetic recording medium has a configuration where the cathode 32 and the cathode accommodating chamber 52 in the sputtering apparatus shown in FIG. 2 are omitted. The method for manufacturing the magnetic recording medium is the same as the method for manufacturing the magnetic recording medium according to the first embodiment apart from sequentially laminating the lower coating layer 12 and the magnetic recording layer 14 on the base material 11 using the sputtering apparatus which has the configuration described above.

Modified Example 2

Figure 5:
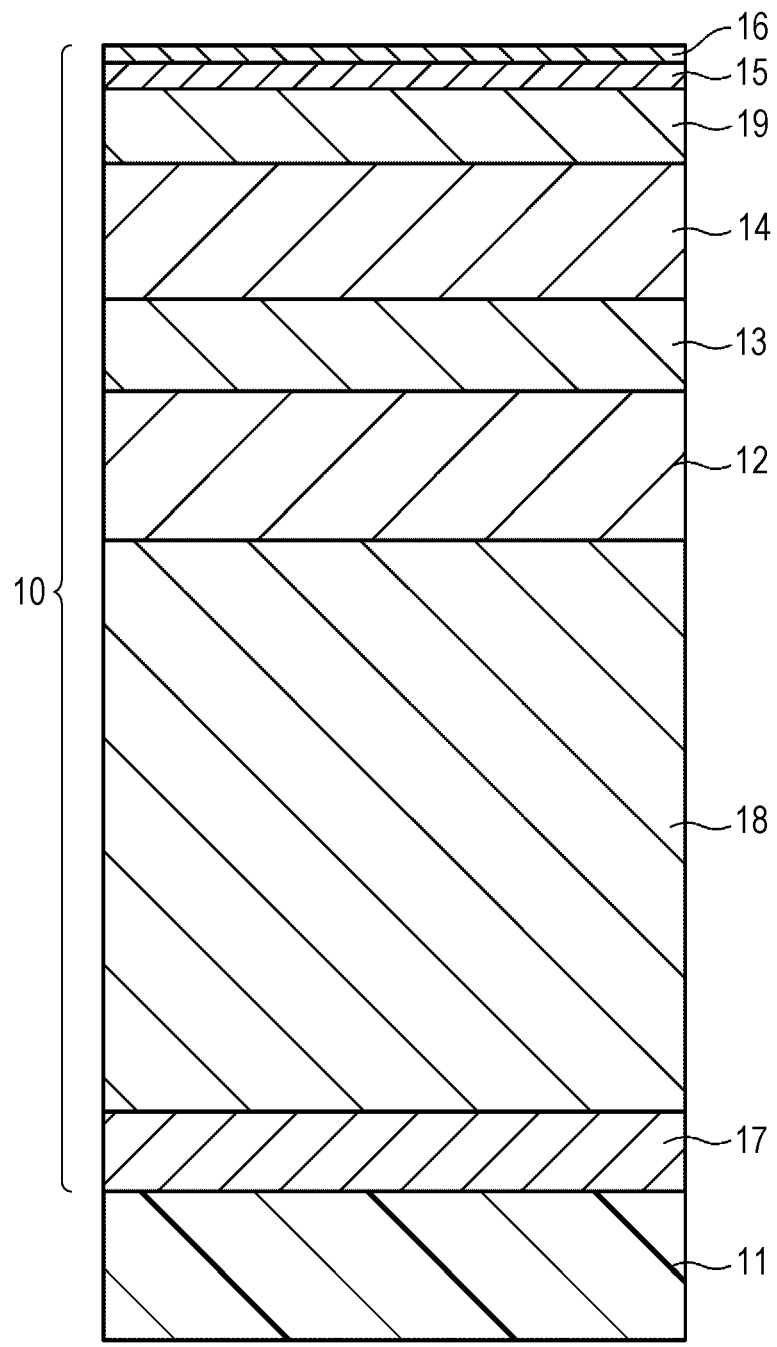
FIG. 5 is a cross-sectional diagram which schematically shows one example of a configuration of a magnetic recording medium according to a modified example 2 of one embodiment of the present technique.

As shown in FIG. 5, a magnetic recording medium may be further provided with a lower coating layer 17 and a soft magnetic underlayer (referred to below as "SUL") 18 between the base material 11 and the lower coating layer 12. The lower coating layer 17 is provided on the base material 11 side and the SUL 18 is provided on the lower coating layer 12 side. In addition, a CAP layer (a stack layer) 19 may be further provided between the magnetic recording layer 14 and the protective layer 15. The lower coating layer 17, the SUL 18, and the CAP layer 19 may all be provided; however, one or more types out of these layers may be provided.

Lower Coating Layer

It is possible to use the same lower coating layer as the lower coating layer 12 in the first embodiment as the lower coating layer 17.

SUL

The film thickness of the SUL 18 is preferably 40 nm or more, more preferably 40 nm or more to 140 nm or less. When the film thickness is less than 40 nm, there is a tendency for the recording and play back characteristics to decrease. On the other hand, when the film thickness exceeds 140 nm, the decrease in the crystal orientation of the intermediate layer 13 due to coarsening of the crystal particles of the SUL 18 is remarkable, the film-forming time of the SUL 18 is longer, and there is a concern that a decrease in productivity will occur. The SUL 18 includes a soft magnetic material in an amorphous state. It is possible to use, for example, a Co-based material, a Fe-based material, or the like as the soft magnetic material. Examples of the Co-based material include CoZrNb, CoZrTa, CoZrTaNb, and the like. Examples of the Fe-based material include FeCoB, FeCoZr, FeCoTa, and the like.

Since the SUL 18 has an amorphous state, the SUL 18 does not play a role of promoting epitaxial growth in a layer which is formed on the SUL 18; however, there is a demand to not disturb crystal orientation of the intermediate layer 13 which is formed on the SUL 18. For that, it is preferable to have a minute structure where the soft magnetic material does not form a column; however, in a case where the influence of degassing such as water from the base material 11 is large, there is a concern that the soft magnetic material will be coarsened and disturb the crystal orientation of the intermediate layer 13 which is formed on the SUL 18. In order to suppress these influences, it is preferable that the lower coating layer 17 is provided on the surface of the base material 11. In particular, in a case of using a polymer material film, in which a large amount of water or gasses such as oxygen are absorbed, as the base material 11, it is preferable that the lower coating layer 17 is provided in order to suppress these influences.

The SUL 18 may be an antiparallel coupled SUL (referred to below as "APC-SUL"). The APC-SUL has a structure where two soft magnetic layers are laminated via a thin intermediate layer and magnetization is actively coupled in antiparallel using exchange coupling via the intermediate layer. It is preferable that the film thickness of the soft magnetic layer be substantially the same. The total film thickness of the soft magnetic layer is preferably 40 nm or more, more preferably 40 nm or more to 70 nm or less. When the film thickness is less than 40 nm, there is a tendency for the recording and play back characteristics to decrease. On the other hand, when the film thickness exceeds 70 nm, the film-forming time of the APC-SUL is longer and there is a concern that a decrease in productivity will occur. It is preferable that the material of a soft magnetic layer is the same material and it is possible to use the same material as the SUL 18 described above as the material. The film thickness is, for example, 0.8 nm or more to 1.4 nm or less, preferably 0.9 nm or more to 1.3 nm or less, and more preferably approximately 1.1 nm. It is possible to obtain more favorable recording and play back characteristics by selecting the film thickness of the intermediate layer within a range of 0.9 nm or more to 1.3 nm or less. Examples of a material of an intermediate layer include V, Cr, Mo, Cu, Ru, Rh, Re, and the like, and Ru is particularly preferable.

CAP Layer

A laminated structure formed of the magnetic recording layer 14 which has a granular structure and the CAP layer 19 is generally referred to as coupled granular continuous (CGC). It is preferable that the film thickness of the CAP layer 19 is 4 nm or more to 12 nm or less. It is possible to obtain more favorable recording and play back characteristics by selecting a film thickness of the CAP layer 19 within a range of 4 nm or more to 12 nm or less. The CAP layer 19 includes, for example, a CoCrPt-based material. Examples of the CoCrPt-based material include CoCrPt, CoCrPtB, a material where a metal oxide is further added to these materials (CoCrPt-metal oxide or CoCrPtB-metal oxide), and the like. It is possible to use at least one type which is selected from a group formed of, for example, Si, Ti, Mg, Ta, Cr, and the like as a metal oxide to be added. Specific examples thereof include $SiO_2$, $TiO_2$, $MgO$, $Ta_2O_5$, $Cr_2O_3$, a mixture of two or more types thereof, and the like.

A sputtering apparatus for manufacturing the magnetic recording medium may be provided with a number, which is equivalent to the number of layers of laminated films which are film-formed on the base material 11, of the cathodes 31 to 33 and the cathode accommodating chambers 51 to 52 in the sputtering apparatus shown in FIG. 2. In more detail, for example, 6 cathodes and cathode accommodating chambers may be provided, which is equivalent to the number of the 6 layers of the lower coating layer 17, the SUL 18, the lower coating layer 12, the intermediate layer 13, the magnetic recording layer 14, and the CAP layer 19. The method for manufacturing the magnetic recording medium is the same as the method for manufacturing the magnetic recording medium according to the first embodiment apart from sequentially laminating the lower coating layer 17, the SUL 18, the lower coating layer 12, the intermediate layer 13, the magnetic recording layer 14, and the CAP layer 19 on the base material 11 using a sputtering apparatus which has the configuration described above.

EXAMPLES

Below, detailed description will be given of the present technology using examples; however, the present technology is not only limited to these examples.

Description will be given of examples of the present technology in the following order.

i. Relationships between an inner wall surface temperature and an $H_2O$ partial pressure and between an $H_2O$ partial pressure and magnetic characteristics ii. A relationship between sputtering discharge time, an inner wall surface temperature, and magnetic characteristics iii. A relationship between sputtering film-forming length, an $H_2O$ partial pressure, and magnetic characteristics i. A Relationship Between an Inner Wall Surface Temperature and an $H_2O$ Partial Pressure and Between an $H_2O$ Partial Pressure and Magnetic Characteristics Reference Example 1

Using a sputtering apparatus which has the configuration shown in FIG. 2, a magnetic tape was manufactured as follows. Here, in the present embodiment, the same reference numerals are given to the portions which correspond to the embodiment described above.

Firstly, the targets 41 to 43 below were respectively attached to the cathodes 31 to 33.

Target 41: $Ti_{30}Cr_{70}$ target

Target 42: Ru target

Target 43: $(Co_{75}Cr_{10}Pt_{15})_{90}$—$(SiO_2)_{10}$ target

Next, the inside of the film-forming chamber 21 and the insides of the cathode accommodating chambers 51 to 53 were vacuumed. Here, it was possible to obtain a degree of vacuum appropriate for the film quality of a thin film which is film-formed by each of the targets 41 to 43 by independently carrying out vacuuming and exhausting control of the cathode accommodating chambers 51 to 53. Next, film-forming was performed as follows without performing a heating process on the wall sections of the cathode accommodating chambers 51 to 53. That is, the lower coating layer 12, the intermediate layer 13, and the magnetic recording layer 14 were sequentially film-formed on the surface of the moving polymer film 11 with a strip shape by carrying out sputtering on the targets 41 to 43 which were respectively attached to the cathodes 31 to 33 while introducing Ar gas into the film-forming chamber 21. In addition, the temperature of the inner wall surface of the cathode accommodating chambers 51 to 53 and an $H_2O$ partial pressure inside the cathode accommodating chambers 51 to 53 during the film-forming of each layer were measured. Here, temperature control of wall sections of the cathode accommodating chambers 51 to 53 was not performed during the film-forming. Due to the above, a magnetic tape with a strip shape was obtained.

Next, coercive force (Hc) of the magnetic recording layer 14 of the obtained magnetic tape was obtained using a vibrating sample magnetometer (VSM). Next, variation in the obtained coercive force was determined by the following formula.

(Variation in coercive force)=100−[((coercive force of a magnetic tape manufactured at a predetermined inner wall surface temperature)/(coercive force of a magnetic tape manufactured at an inner wall surface temperature of 20° C.))×100] [%]

Measurement Result

Figure 6A:
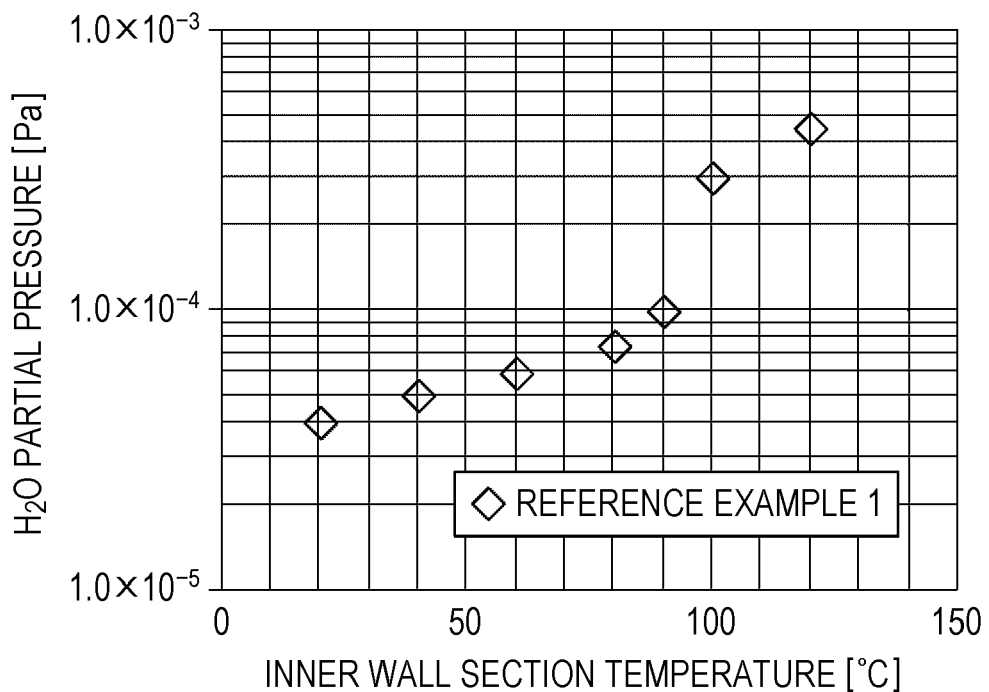
FIG. 6A is a diagram which shows a relationship between an inner wall surface temperature of a cathode accommodating chamber and an $H_2O$ partial pressure inside the cathode accommodating chamber.
Figure 6B:
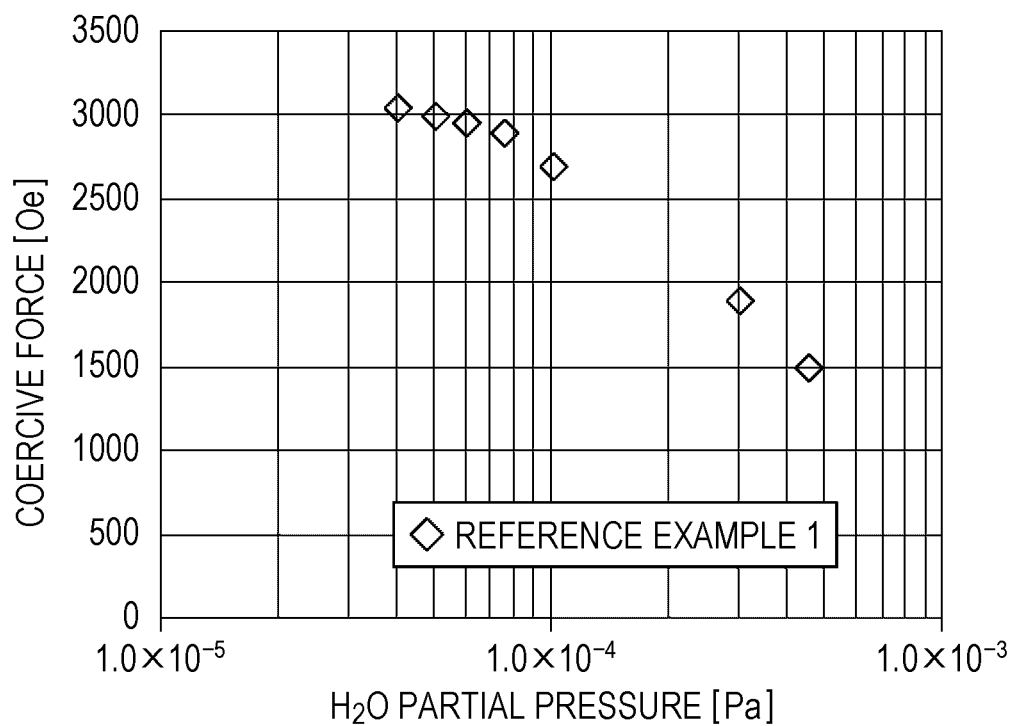
FIG. 6B is a diagram which shows a relationship between an $H_2O$ partial pressure inside a cathode accommodating chamber and coercive force of a magnetic tape.

Table 1 shows measurement results of the temperature of an inner wall surface of the cathode accommodating chamber 51 and the $H_2O$ partial pressure inside the cathode accommodating chamber 51 when manufacturing the magnetic tape in the reference example 1. In addition, measurement results of the coercive force of a magnetic tape which is manufactured at each inner wall surface temperature and variations thereof are also shown. FIG. 6A shows a relationship between the inner wall surface temperature of the cathode accommodating chamber 51 and the $H_2O$ partial pressure inside the cathode accommodating chamber 51. FIG. 6B shows a relationship between the $H_2O$ partial pressure inside the cathode accommodating chamber 51 and the coercive force of the magnetic recording layer 14. Here, since the inner wall surface temperature and the $H_2O$ partial pressure of each of the cathode accommodating chambers 51 to 53 are substantially the same, only the inner wall surface temperature and the $H_2O$ partial pressure of the cathode accommodating chamber 51 are representatively shown in Table 1, FIG. 6A, and FIG. 6B.

TABLE 1

| | Reference Example 1 | | |
|---|---|---|---|
| Temperature of inner wall section [° C.] | $H_2O$ Partial Pressure [Pa] | ⊥ Hc [Oe] | ⊥ Hc Variation [%] |
| 20 | $4.00 \times 10^{-5}$ | 3050 | — |
| 40 | $5.00 \times 10^{-5}$ | 3000 | 1.64 |
| 60 | $6.00 \times 10^{-5}$ | 2960 | 2.95 |
| 80 | $7.50 \times 10^{-5}$ | 2900 | 4.92 |
| 90 | $1.00 \times 10^{-4}$ | 2700 | 11.48 |
| 100 | $3.00 \times 10^{-4}$ | 1900 | 37.70 |
| 120 | $4.50 \times 10^{-4}$ | 1500 | 50.82 |

The following is understood from the measurement results described above.

$H_2O$ Partial Pressure

There is a tendency for the $H_2O$ partial pressure inside the cathode accommodating chambers 51 to 53 to increase in accordance with an increase in the temperature of the inner wall surface of the cathode accommodating chambers 51 to 53. In particular, when the temperature of the inner wall surfaces of the cathode accommodating chambers 51 to 53 is 90° C. or higher, the degree of increase in the $H_2O$ partial pressure inside the cathode accommodating chambers 51 to 53 is remarkable.

Magnetic Characteristics

There is a tendency for the coercive force to decrease in accordance with an increase in the $H_2O$ partial pressure inside the cathode accommodating chambers 51 to 53. In particular, when the $H_2O$ partial pressure inside the cathode accommodating chambers 51 to 53 is $1.00 \times 10^{-4}$ or more, the degree of decrease in the coercive force is remarkable. Here, only the measurement results of coercive force are shown as the magnetic characteristics; however, the squareness ratio and the orientation strength $\Delta\theta_{50}$ of the magnetic recording layer 14 also show the same tendency with respect to an increase in the $H_2O$ partial pressure inside the cathode accommodating chambers 51 to 53.

ii. A Relationship Between Sputtering Discharge Time, an Inner Wall Surface Temperature, and Magnetic Characteristics Example 1

Using a sputtering apparatus which has the configuration shown in FIG. 2, the magnetic tape was manufactured as follows. Firstly, the targets 41 to 43 which are the same as the reference example 1 were respectively attached to the cathodes 31 to 33. Next, the inside of the film-forming chamber 21 and the insides of the cathode accommodating chambers 51 to 53 were vacuumed. Here, it was possible to obtain a degree of vacuum appropriate for the film quality of a thin film which is film-formed by each of the targets 41 to 43 by independently carrying out vacuuming and exhausting control of the cathode accommodating chambers 51 to 53. Next, after heating a wall section of each of the cathode accommodating chambers 51 to 53 and keeping the temperature of the inner wall surfaces of the cathode accommodating chambers 51 to 53 at 200° C. or higher for 30 minutes or longer, film-forming was performed as follows. That is, the lower coating layer 12, the intermediate layer 13, and the magnetic recording layer 14 were sequentially film-formed on the surface of the moving polymer film 11 with a strip shape by carrying out sputtering on the targets 41 to 43 which were respectively attached to the cathodes 31 to 33 while introducing Ar gas into the film-forming chamber 21. Here, temperature control was performed which cooled the wall sections of the cathode accommodating chambers 51 to 53 during film-forming to keep a temperature of 90° C. or lower. In addition, the temperature of the inner wall surfaces of the cathode accommodating chambers 51 to 53 during film-forming was measured. Due to the above, a magnetic tape with a strip shape was obtained.

Next, the coercive force (Hc) of the magnetic recording layer 14 of the obtained magnetic tape is determined using a vibrating sample magnetometer. Next, variation in the obtained coercive force was determined by the following formula.

(Variation in coercive force)=100−[((coercive force of a magnetic tape manufactured after a predetermined discharge time passes)/(coercive force of a magnetic tape manufactured after discharge time of 5 minutes passes))×100][%]

Reference Example 2

A magnetic tape was manufactured in the same manner as the reference example 1 and the temperature of the inner wall surfaces of the cathode accommodating chambers 51 to 53 during film-forming was measured. Next, the coercive force (Hc) of the magnetic recording layer 14 of the obtained magnetic tape and variations thereof were obtained in the same manner as example 1.

Measurement Results

Figure 7A:
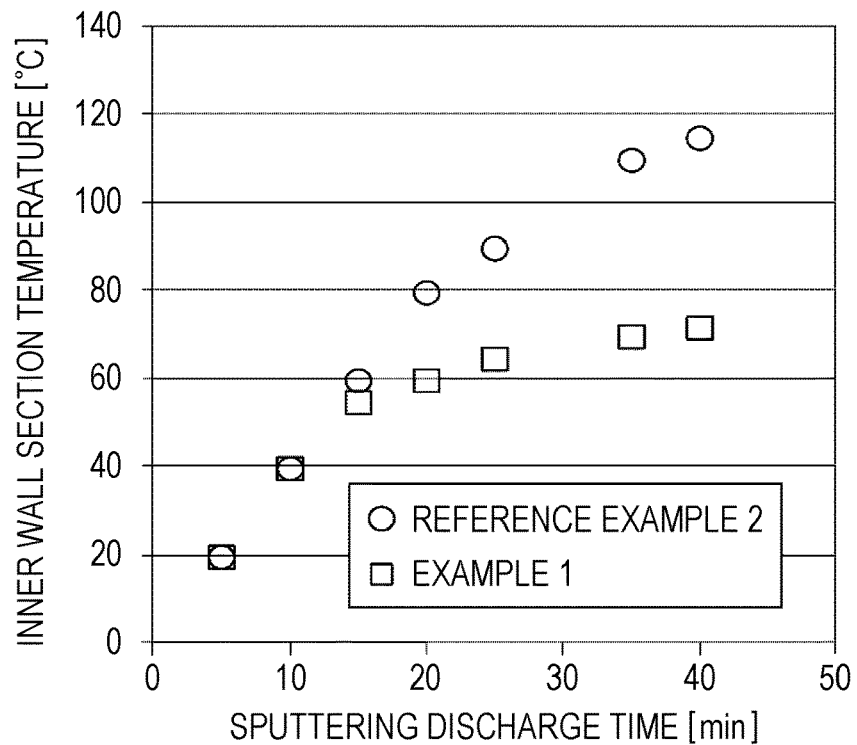
FIG. 7A is a diagram which shows a relationship between a sputtering discharge time and an inner wall surface temperature of a cathode accommodating chamber.
Figure 7B:
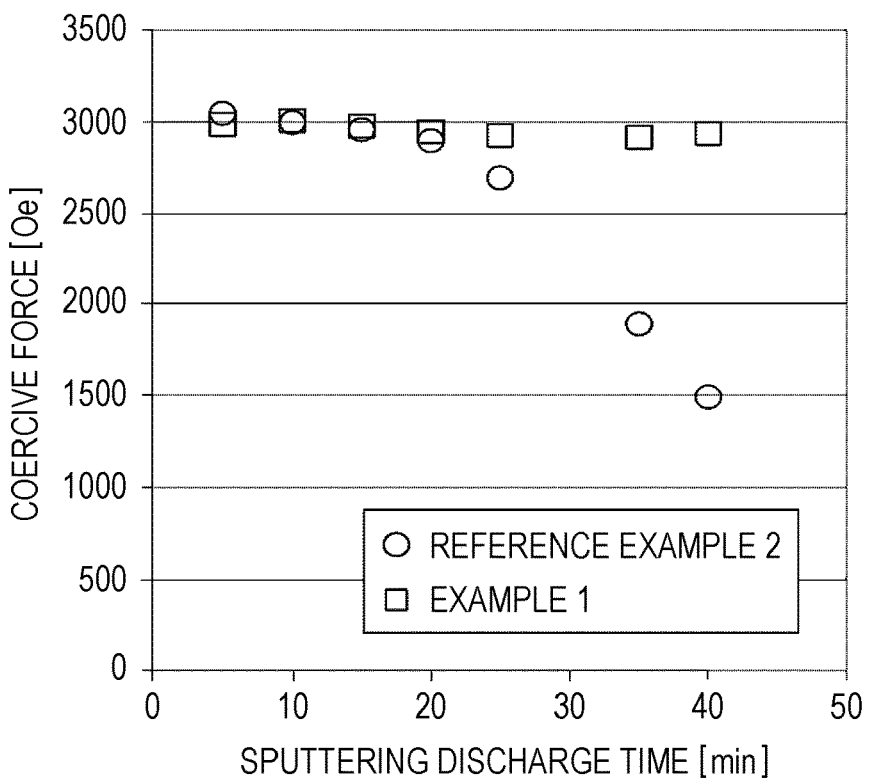
FIG. 7B is a diagram which shows a relationship between a sputtering discharge time and coercive force of a magnetic tape.

Table 2 shows the inner wall surface temperature of the cathode accommodating chamber 51 when manufacturing the magnetic tape in example 1 and the reference example 2, the coercive force of the magnetic tape which is manufactured at each inner wall surface temperature, and variations thereof. FIG. 7A shows a relationship between the sputtering discharge time and the inner wall surface temperature of the cathode accommodating chambers 51 to 53. FIG. 7B shows a relationship between the sputtering discharge time and the coercive force of the magnetic recording layer 14. Here, since changes in the temperature of the inner wall surfaces of each of the cathode accommodating chambers 51 to 53 are substantially the same, only the changes in the temperature of the cathode accommodating chamber 51 are representatively shown in Table 2 and FIG. 7A.

TABLE 2

| | Example 1 | | | Reference Example 2 | | |
|---|---|---|---|---|---|---|
| Discharge Time [min] | Temperature of inner wall section [° C.] | ⊥ Hc [Oe] | ⊥ Hc Variation [%] | Temperature of inner wall section [° C.] | ⊥ Hc [Oe] | ⊥ Hc Variation [%] |
| 5 | 20 | 2990 | — | 20 | 3050 | — |
| 10 | 40 | 3010 | −0.67 | 40 | 3000 | 1.64 |
| 15 | 55 | 2980 | 0.33 | 60 | 2960 | 2.95 |
| 20 | 60 | 2950 | 1.34 | 80 | 2900 | 4.92 |
| 25 | 65 | 2930 | 2.01 | 90 | 2700 | 11.48 |
| 35 | 70 | 2920 | 2.34 | 110 | 1900 | 37.70 |
| 40 | 72 | 2940 | 1.67 | 115 | 1500 | 50.82 |

The following is understood from the measurement results described above.

Temperature of Inner Wall Surface

In reference example 2, there is a tendency for the temperature of the inner wall surface of the cathode accommodating chambers 51 to 53 to increase in accordance with the sputtering discharge time. On the other hand, in example 1, there is a tendency for the temperature of the inner wall surface of the cathode accommodating chambers 51 to 53 to increase in accordance with the sputtering discharge time when the sputtering discharge time is less than 15 minutes; however, when the sputtering discharge time is 15 minutes or longer, the degree of increase in the temperature of the inner wall surface of the cathode accommodating chambers 51 to 53 becomes small and substantially constant.

Magnetic Characteristics

In reference example 2, the coercive force is substantially constant regardless of the sputtering discharge time when the sputtering discharge time is in a range of less than 20 minutes; however, when the sputtering discharge time is 20 minutes or longer, there is a tendency for the coercive force to greatly decrease. On the other hand, in example 1, when the sputtering discharge time is 20 minutes or longer, there is a tendency for the coercive force to be held to be substantially constant regardless of the sputtering discharge time. Here, only the measurement results of coercive force are shown as the magnetic characteristics; however, the squareness ratio and the orientation strength $\Delta\theta_{50}$ of the magnetic recording layer 14 also show the same tendency with respect to an increase in the sputtering discharge time.

Variation in Magnetic Characteristics

In reference example 2, variation in the coercive force after 40 minutes of film-forming greatly exceeds 10%. On the other hand, in example 1, variation in the coercive force after 40 minutes of film-forming is suppressed to less than 10%. Here, only variation in the coercive force is shown as the magnetic characteristics; however, the squareness ratio and the orientation strength $\Delta\theta_{50}$ of the magnetic recording layer 14 also show the same tendency with respect to the increase in the $H_2O$ partial pressure inside the cathode accommodating chambers 51 to 53.

iii. A Relationship Between Sputtering Film-Forming Length, an $H_2O$ Partial Pressure, and Magnetic Characteristics Example 2

A magnetic tape was manufactured in the same manner as example 1 and an $H_2O$ partial pressure inside the cathode accommodating chambers 51 to 53 was measured. Next, the coercive force (Hc) and the squareness ratio of the magnetic recording layer 14 of the obtained magnetic tape were determined using a vibrating sample magnetometer. Next, variations in the obtained coercive force and squareness ratio were obtained by the following formula.

(Variation in coercive force)=100−[((coercive force after predetermined sputtering film-forming length film-forming)/(coercive force of sputtering film-forming length of substantially 0 m))×100][%]

(Variation in squareness ratio)=100−[((squareness ratio after predetermined sputtering film-forming length film-forming)/(squareness ratio of sputtering film-forming length of substantially 0 m))×100][%]

Here, the sputtering film-forming length has the meaning of the length of a laminated film which is continuously film-formed in a longitudinal direction of a polymer film with a strip shape (a laminated film of the lower coating layer 12, the intermediate layer 13, and the magnetic recording layer 14).

Next, the orientation strength $\Delta\theta_{50}$ was determined by measuring diffraction peaks of magnetic atoms included in the magnetic recording layer 14 in X-ray diffraction peaks of the magnetic tape using a locking curve method. Next, a variation in the obtained orientation strength $\Delta\theta_{50}$ was determined by the following formula.

(Variation in $\Delta\theta_{50}$)=100−[((orientation strength $\Delta\theta_{50}$ after predetermined sputtering film-forming length film-forming)/(orientation strength $\Delta\theta_{50}$ of sputtering film-forming length of substantially 0 m))×100][%]

Reference Example 3

A magnetic tape was manufactured in the same manner as the reference example 1 and the $H_2O$ partial pressure inside the cathode accommodating chambers 51 to 53 was measured. Next, the coercive force (Hc), the squareness ratio, the orientation strength $\Delta\theta_{50}$, and variations thereof of the magnetic recording layer 14 of the obtained magnetic tape were determined in the same manner as example 2.

Measurement Results

Figure 8A:
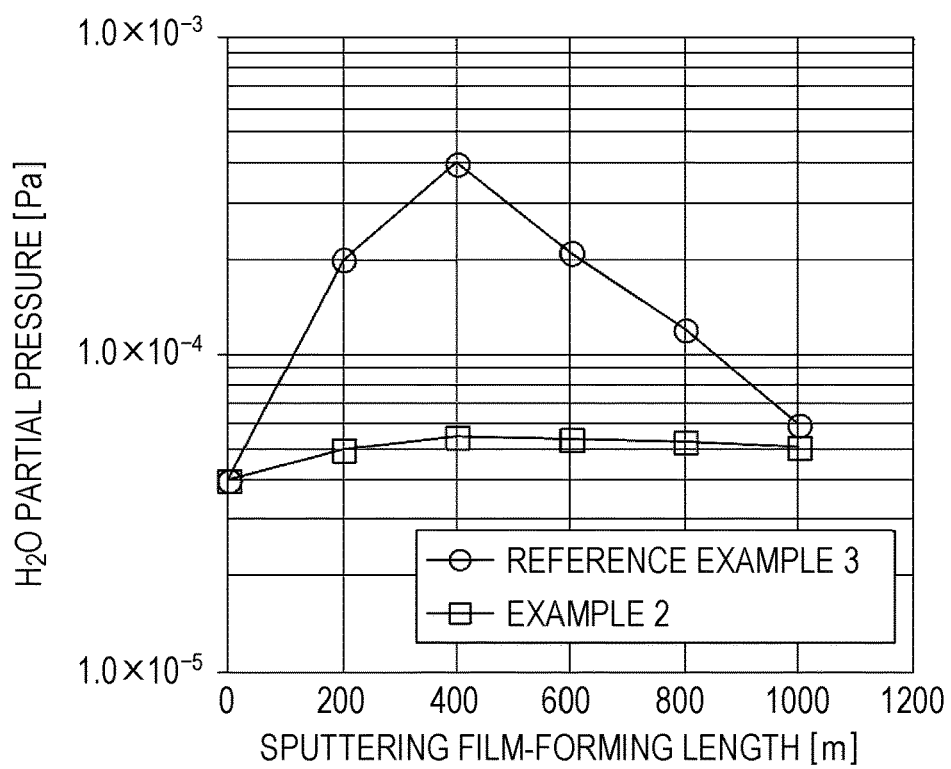
FIG. 8A is a diagram which shows a relationship between a sputtering film-forming length and an $H_2O$ partial pressure inside a cathode accommodating chamber.
Figure 8B:
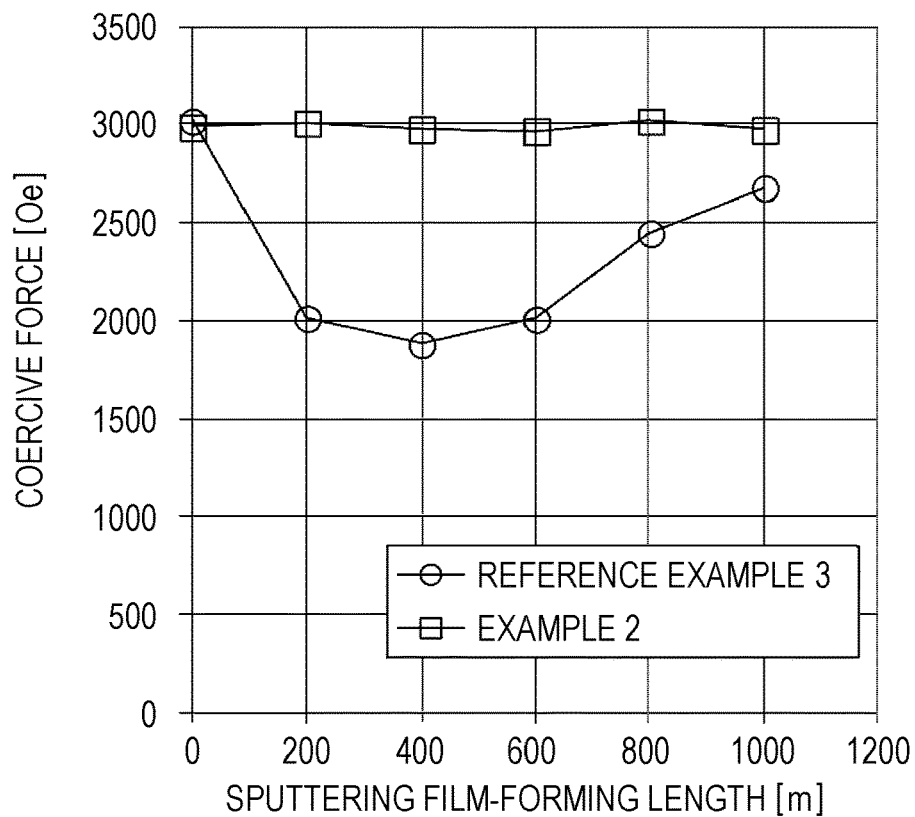
FIG. 8B is a diagram which shows a relationship between a sputtering film-forming length and coercive force of a magnetic tape.
Figure 9A:
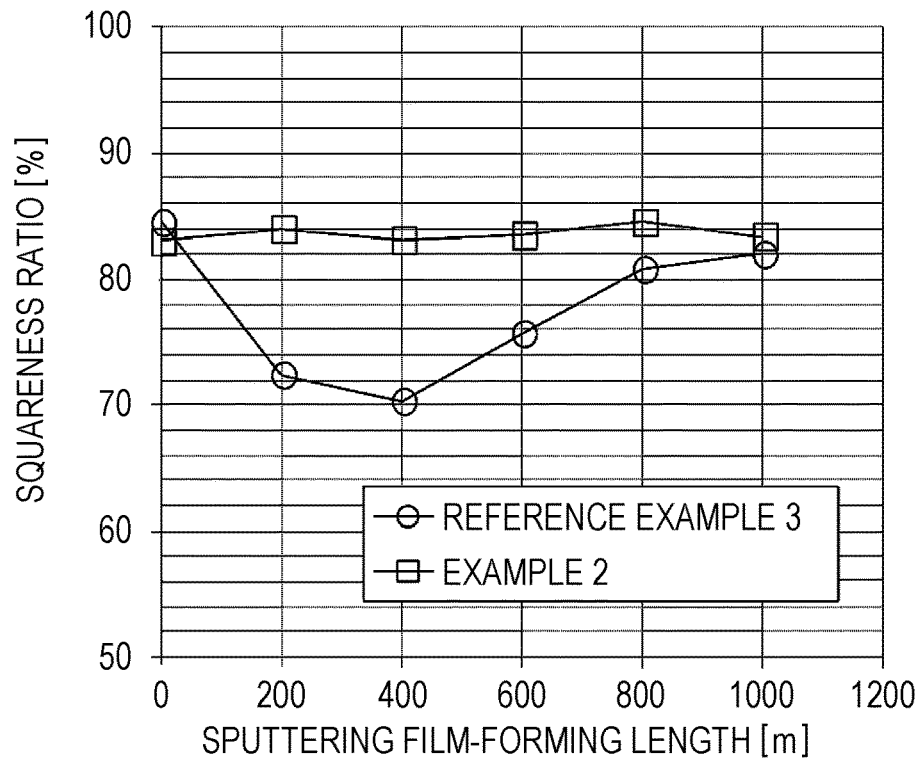
FIG. 9A is a diagram which shows a relationship between a sputtering film-forming length and a squareness ratio of a magnetic tape.
Figure 9B:
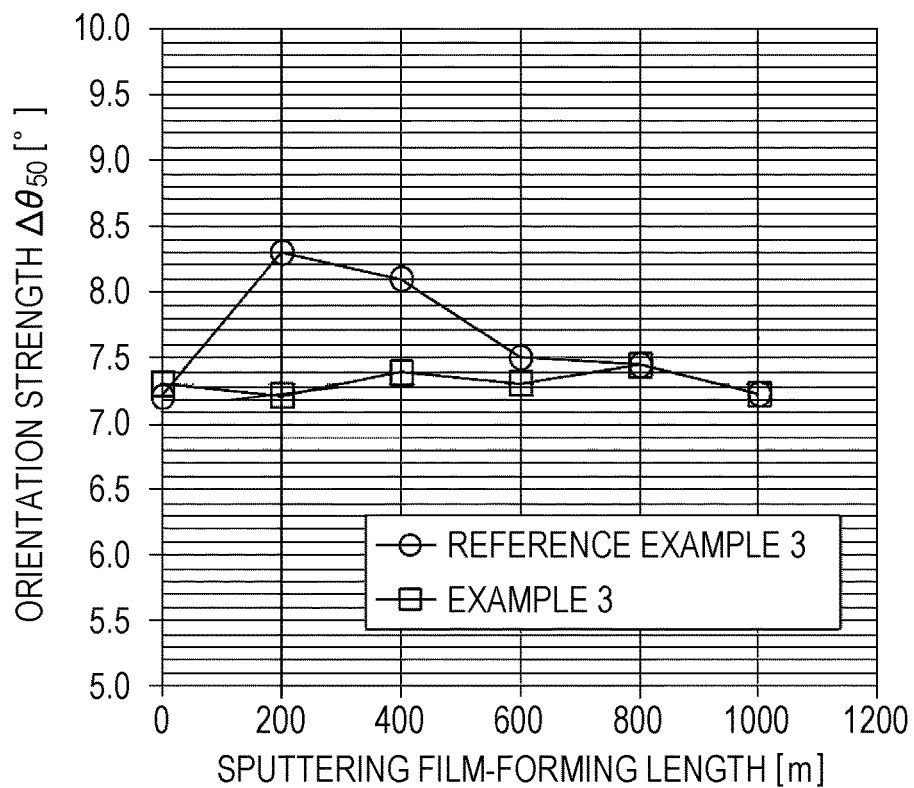
FIG. 9B is a diagram which shows a relationship between a sputtering film-forming length and orientation strength $\Delta\theta_{50}$ of a magnetic recording layer of a magnetic tape.

Table 3 and Table 4 each show the $H_2O$ partial pressure inside the cathode accommodating chamber 51 when manufacturing the magnetic tape in example 2 and reference example 3, and the coercive force, the squareness ratio, orientation strength $\Delta\theta_{50}$, and variations thereof in magnetic tapes manufactured at each pressure. FIG. 8A shows a relationship between a sputtering film-forming length and the $H_2O$ partial pressure inside the cathode accommodating chamber 51. FIG. 8B shows a relationship between the sputtering film-forming length and the coercive force. FIG. 9A shows a relationship between the sputtering film-forming length and the squareness ratio. FIG. 9B shows a relationship between the sputtering film-forming length and the orientation strength $\Delta\theta_{50}$ of the magnetic recording layer 14. Here, since changes in the partial pressure of the inner wall surfaces of each of the cathode accommodating chambers 51 to 53 are substantially the same, only the changes in the partial pressure of the cathode accommodating chamber 51 are representatively shown in Table 3 and FIG. 8A.

TABLE 3

| Sputtering film-forming length [m] | Example 2 | | | | | |
|---|---|---|---|---|---|---|
| | ⊥ Hc [Oe] | ⊥ Hc Variation [%] | ⊥ Rs [%] | ⊥ Rs Variation [%] | $\Delta\theta_{50}$ [°] | $\Delta\theta_{50}$ Variation [%] | $H_2O$ Partial Pressure [Pa] |
| 0 | 2990 | — | 83.0 | — | 7.3 | — | $4.00 \times 10^{-5}$ |
| 200 | 3010 | −0.67 | 84.0 | −1.20 | 7.2 | 1.37 | $5.00 \times 10^{-5}$ |
| 400 | 2980 | 0.33 | 83.1 | −0.12 | 7.4 | −1.37 | $5.50 \times 10^{-5}$ |
| 600 | 2970 | 0.67 | 83.5 | −0.60 | 7.3 | 0.00 | $5.40 \times 10^{-5}$ |
| 800 | 3020 | −1.00 | 84.5 | −1.81 | 7.4 | −1.37 | $5.30 \times 10^{-5}$ |
| 1000 | 2975 | 0.50 | 83.4 | −0.48 | 7.2 | 1.37 | $5.10 \times 10^{-5}$ |

TABLE 4

| Sputtering film-forming length [m] | Example 3 | | | | | |
|---|---|---|---|---|---|---|
| | ⊥ Hc [Oe] | ⊥ Hc Variation [%] | ⊥ Rs [%] | ⊥ Rs Variation [%] | $\Delta\theta_{50}$ [°] | $\Delta\theta_{50}$ Variation [%] | $H_2O$ Partial Pressure [Pa] |
| 0 | 3020 | — | 84.5 | — | 7.2 | — | $4.00 \times 10^{-5}$ |
| 200 | 2015 | 33.28 | 72.4 | 14.32 | 8.3 | −15.28 | $2.00 \times 10^{-4}$ |
| 400 | 1880 | 37.75 | 70.3 | 16.80 | 8.1 | −12.50 | $4.00 \times 10^{-4}$ |
| 600 | 2010 | 33.44 | 75.7 | 10.41 | 7.5 | −4.17 | $2.10 \times 10^{-4}$ |
| 800 | 2450 | 18.87 | 80.8 | 4.38 | 7.4 | −2.78 | $1.20 \times 10^{-4}$ |
| 1000 | 2680 | 11.26 | 82.0 | 2.96 | 7.2 | 0.00 | $6.00 \times 10^{-5}$ |

The following is understood from the measurement results described above.

$H_2O$ Partial Pressure

In reference example 3, while the $H_2O$ partial pressure increases in accordance with the sputtering film-forming length becoming longer when the sputtering film-forming length is less than 400 m, there is a tendency for the $H_2O$ partial pressure to decrease in accordance with the sputtering film-forming length becoming longer when the sputtering film-forming length is 400 m or longer. On the other hand, in example 2, there is a tendency for the $H_2O$ partial pressure to be stay substantially constant without depending on the sputtering length.

Magnetic Characteristics

In reference example 3, while the coercive force and the squareness ratio decrease in accordance with the sputtering film-forming length becoming longer when the sputtering film-forming length is less than 400 m, there is a tendency for the coercive force and the squareness ratio to increase when the sputtering film-forming length is 400 m or longer. On the other hand, in example 2, there is a tendency for the coercive force and the squareness ratio to be kept substantially constant without depending on the sputtering length.

In reference example 3, while the orientation strength $\Delta\theta_{50}$ of the magnetic recording layer 14 is widened in accordance with the sputtering film-forming length becoming longer when the sputtering film-forming length is less than 200 m, there is a tendency for the orientation strength $\Delta\theta_{50}$ of the magnetic recording layer 14 to be narrowed when the sputtering film-forming length is 200 m or longer. On the other hand, in example 2, there is a tendency for the orientation strength $\Delta\theta_{50}$ of the magnetic recording layer 14 to be kept substantially constant without depending on the sputtering length.

Variation in Magnetic Characteristics

In reference example 3, variations in the coercive force, squareness ratio, and orientation strength $\Delta\theta_{50}$ of the magnetic recording layer 14 exceed ±10% in a division of 200 m or less in the longitudinal direction of the magnetic tape. On the other hand, in example 2, variations in the coercive force, squareness ratio, and orientation strength $\Delta\theta_{50}$ of the magnetic recording layer 14 are within ±10% over a division of 1000 m in the longitudinal direction of the magnetic tape.

Above, detailed description was given of embodiments of the present technology and modified examples and examples thereof; however, the present technology is not limited to the embodiments and modified examples and examples thereof described above and various types of modifications are possible based on the technical idea of the present technique.

For example, the configurations, the methods, the processes, the shapes, the materials, the numeric values, and the like which are given in the embodiments and the modified examples and examples thereof are merely examples and configurations, methods, processes, shapes, materials, numeric values, and the like which are different therefrom may be used as necessary.

In addition, the configurations, the methods, the processes, the shapes, the materials, the numeric values, and the like of the embodiments and the modified examples and examples thereof described above are able to be combined with each other within a scope which does not depart from the gist of the present technique.

In addition, the present technology is also able to adopt the following configurations.

(1) A magnetic recording medium including a base material which has flexibility, and a laminated film, in which a variation in magnetic characteristics is within □10% over a division of 300 m in a longitudinal direction of the base material.

(2) The magnetic recording medium according to (1), in which the laminated film includes a lower coating layer and a perpendicular recording layer.

(3) The magnetic recording medium according to (2), in which the lower coating layer includes Ti and Cr, and the perpendicular recording layer has a granular structure where particles which include Co, Pt, and Cr are separated by an oxide.

(4) The magnetic recording medium according to (2) or (3), in which the lower coating layer has an amorphous state.

(5) The magnetic recording medium according to any one of (2) to (4), in which the laminated film further includes an intermediate layer.

(6) The magnetic recording medium according to (5), in which the intermediate layer includes Ru or NiW.

(7) The magnetic recording medium according to any one of (2) to (6), in which the laminated film further includes at least one type of layer out of a soft magnetic layer and a CAP layer.

(8) The magnetic recording medium according to any one of (1) to (7), in which a variation in magnetic characteristics is within ±5% over a division of 300 m or more in the longitudinal direction of the base material.

(9) The magnetic recording medium according to any one of (1) to (8), in which the magnetic characteristics are a holding power Hc, a squareness ratio Rs, and an orientation strength $\Delta\theta_{50}$.

(10) The magnetic recording medium according to any one of (1) to (9), in which the laminated film is film-formed by a physical deposition method.

(11) The magnetic recording medium according to (10), in which the physical deposition method is a sputtering method.

(12) A film-forming apparatus including a rotating body which moves a base material with a strip shape which has flexibility, a plurality of cathodes which are provided to oppose a rotating surface of the rotating body, and a plurality of accommodating sections which accommodate each of the plurality of cathodes.

(13) The film-forming apparatus according to (12), in which the plurality of accommodating sections are configured so as to be able to exhaust a vacuum and to carry out heating and cooling.

(14) A method for manufacturing a magnetic recording medium including sequentially film-forming a plurality of thin films on a base material using a plurality of cathodes which are provided on a moving path of the base material while moving the base material with a strip shape which has flexibility, in which each of the plurality of cathodes is accommodated in the plurality of accommodating sections.

(15) The method for manufacturing a magnetic recording medium according to (14), further including heating the plurality of accommodating sections before film-forming the plurality of thin films.

(16) The method for manufacturing a magnetic recording medium according to (15), in which a temperature of inner walls of the plurality of accommodating sections is held at 200° C. or higher for 30 minutes or longer by the heating.

(17) The method for manufacturing a magnetic recording medium according to any one of (14) to (16), further including cooling the plurality of accommodating sections while film-forming the plurality of thin films.

(18) The method for manufacturing a magnetic recording medium according to (17), in which the temperature of inner walls of the plurality of accommodating sections is held at 90° C. or lower by the cooling. It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for manufacturing a magnetic recording medium comprising:
   sequentially film-forming a plurality of thin films on a base material using a plurality of cathodes which are provided on a moving path of the base material while moving the base material with a strip shape which has flexibility,
   wherein each of the plurality of cathodes is accommodated in a plurality of accommodating sections, and
   wherein $H_2O$ partial pressure inside the accommodating sections is less than $1.00\times10^{-4}$ Pa and temperature of inner walls of the accommodating sections that accommodate the cathodes is 80° C. or lower during film-forming.

2. The method for manufacturing a magnetic recording medium according to claim 1 further comprising:
   cooling the plurality of accommodating sections while film-forming the plurality of thin films.

3. The method for manufacturing a magnetic recording medium according to claim 1, further comprising:
   heating the plurality of accommodating sections before film-forming the plurality of thin films.

4. The method for manufacturing a magnetic recording medium according to claim 3,
   wherein a temperature of inner walls of the plurality of accommodating sections is held at 200° C. or higher for 30 minutes or longer by the heating.

* * * * *